US008438436B1

(12) United States Patent
Baker et al.

(10) Patent No.: US 8,438,436 B1
(45) Date of Patent: May 7, 2013

(54) SECURE DESIGN-FOR-TEST SCAN CHAINS

(75) Inventors: Matthew P. Baker, San Francisco, CA (US); Weiguang Lu, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 368 days.

(21) Appl. No.: 12/794,221

(22) Filed: Jun. 4, 2010

(51) Int. Cl.
*G01R 31/28* (2006.01)

(52) U.S. Cl.
USPC ............................ 714/726; 714/733; 714/34

(58) Field of Classification Search .................. 714/726, 714/733, 34, 31, 25
See application file for complete search history.

(56) References Cited

U.S. PATENT DOCUMENTS

| 7,444,546 B2 * | 10/2008 | Kimelman et al. ............. 714/31 |
| 7,634,701 B2 * | 12/2009 | Morgan et al. ................ 714/726 |
| 2004/0210797 A1 * | 10/2004 | Kimelman et al. ............. 714/25 |

OTHER PUBLICATIONS

Bonnenberg et al., "Vinci: Secure Test of a VLSI High-Speed Encryption System", International Test Conference 1993, Paper 36.3, pp. 782-790, 1993 IEEE.
Dangat, "Efficient Scan Design Using DFT Compiler", Cypress Semiconductor, SNUG Boston 2004 Proceedings, pp. 1-18.
Hely et al., "A secure Scan Designs Methodology", Design, automation and Test in Europe, 2006, Mar. 6-10, 2006, vol. 1, pp. 1-2, Munich.
Hely et al., "Scan Design and Secure Chip", Proceedings of the 10th IEEE International On-Line Testing Symposium (IOLTS'04), IEEE 2004, Funchal, Portugal, Jul. 12-14, pp. 219-224.
Hely et al., "Secure Scan Techniques: a Comparison", Proceedings of the 12th IEEE International On-Line Testing Symposium (IOLTS'06), IEEE 2006, Jul. 26, 2006, 6 pp., Lake Como.
Hely et al., "Test Control for Secure Scan Designs", Proceedings of the European Test Symposium (EtdS'05), IEEE 2005, Tallinn, Estonia, May 22-25, 2005, pp. 190-195.
Jaramillo, et al., "Ten Commandments of Scan Design", VLSI Technology, Inc., SNUG San Jose 2000, pp. 1-42.
Yang et al., "Secure Scan: A Design-for-Test Architecture for Crypto Chips", DAC 2005, Jun. 13-17, 2005, pp. 135-140, Anaheim, CA, USA.

* cited by examiner

*Primary Examiner* — Fritz Alphonse
(74) *Attorney, Agent, or Firm* — Kevin T. Cuenot

(57) ABSTRACT

A method of securing a design-for-test scan chain within a programmable integrated circuit device (IC) can include placing the programmable IC in an operational mode and responsive to a request to access a scan chain within the programmable IC, selectively enabling a secure mode within the programmable IC according to a configuration state of the programmable IC. Enabling secure mode within the programmable IC can provide access to the scan chain. Responsive to enabling the secure mode, the programmable IC can remain in the secure mode and be prevented from re-entering the operational mode until the programmable IC is power cycled.

20 Claims, 2 Drawing Sheets

SECURE DESIGN-FOR-TEST SCAN CHAINS

FIELD OF THE INVENTION

One or more embodiments disclosed within this specification relate to integrated circuit devices (ICs). More particularly, one or more embodiments relate to securing scan chains for use within an IC.

BACKGROUND

Programmable integrated circuit devices (IC) are a well-known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable circuit elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is a complex programmable logic device, or CPLD. The CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

As ICs, including programmable ICs, increase in size and number of components, the probability that a manufacturing or design fault will occur within the ICs also increases. These manufacturing and design faults can render the IC inoperable. Design-for-test (DFT) features implemented within the IC are intended to detect manufacturing and design faults that can affect the operability of the IC. One such DFT feature is the implementation of scan chains within the IC.

In general, a "scan chain" refers to a series of flip-flops within an IC that are coupled together. Each flip-flop of the scan chain is coupled to the next nearest flip-flop within the IC thereby forming, in effect, a shift register. Although additional flip-flops used only for the purpose of scan chain implementation may be necessary, in some cases, scan chains can be implemented solely with flip-flops that already exist as part of the operational circuitry of the IC, thereby performing a dual purpose.

Scan chains generally can be thought of in terms of test scan chains and result scan chains. A test scan chain typically is implemented to provide input DFT data to a particular circuit region or particular circuit device within the IC. A result scan chain typically is implemented to receive output DFT data from a particular circuit region or a particular circuit device within the IC.

Within a test scan chain, each flip-flop can be implemented with a first input that receives operational data for use in operational functions of the IC, e.g., non-scan chain related functions. Each flip-flop further can include a second input that provides a side channel through which test data, e.g., input DFT data, can be input to the flip-flop. Through an input port coupled to a first flip-flop of the test scan chain, the input DFT data can be clocked, or sequenced, through each flip-flop within the test scan chain. The input DFT data received by each flip-flop can be a test input to a particular section of circuitry, or a particular device, within the IC undergoing fault testing. For example, the input DFT data that is output from a first flip-flop of the test scan chain can serve as a first test input to a first circuit region of the IC. The input DFT data that is output from a second flip-flop of the test scan chain can serve as a second test input provided to a second circuit region of the IC.

Within a result scan chain, each flip-flop can be implemented with a first input that receives operational data for use in operational functions, i.e., non-scan chain related functions, within the IC. Each flip-flop within the result scan chain also can include a second input that receives output DFT data from a section of circuitry, or a device, within the IC being tested for faults. Through an output port coupled to a last flip-flop of the result scan chain, output DFT data can be output from each flip-flop of the result scan chain. For example, the output DFT data that is input to a first flip-flop of a result scan chain can be received from a first selected region of circuitry of the IC. The output DFT data that is input to a second flip-flop of the result scan chain can be received from a second selected region of circuitry of the IC.

Thus, input DFT data such as a test vector can be propagated through the test scan chain to selected portion of the IC for testing. The test vector can set each particular section of circuitry within the IC to be tested for faults to a known state. Subsequently, each section of circuitry can be executed for one clock cycle and the resulting output DFT data from each section of circuitry can be input to the result scan chain. The output DFT data can be propagated out of the result scan chain as a result vector. The result vector can be compared to expected results to determine a number and a location of manufacturing and design faults within the IC.

Although useful for testing and debugging ICs, scan chains can create security vulnerabilities since scan chains can, in some circumstances, provide unauthorized users, e.g., "attackers," with access to sensitive data stored within the IC. For example, using physical attacks, unauthorized users can input data vectors to, and output data vectors from, the scan chain while placing the IC in an operational mode. In this manner, internal operational features and circuit implementations within the IC can be ascertained by the attacker via a comparison of the input to, and resulting output from, the scan chains.

SUMMARY

One or more embodiments disclosed within this specification relate to integrated circuit devices (ICs) and, more particularly, to securing scan chains for use within an IC. One embodiment of the present invention can include a method of securing a design-for-test (DFT) scan chain within a programmable integrated circuit device (IC). The method can include placing the programmable IC in an operational mode and, responsive to a request to access a scan chain within the programmable IC, selectively enabling a secure mode within the programmable IC according to a configuration state of the programmable IC. Enabling secure mode within the programmable IC can provide access to the scan chain. Responsive to enabling the secure mode, the programmable IC can be retained in the secure mode and prevented from re-entering the operational mode until the programmable IC is power cycled.

Another embodiment of the present invention can include a method of securing a DFT scan chain within a programmable IC including placing the programmable IC in an operational mode and, responsive to a request to access a scan chain within the programmable IC, determining a configuration state of the programmable IC and selectively providing access to the scan chain through enablement of a secure mode within the programmable IC according to the configuration state of the programmable IC. Responsive to determining that the programmable IC is configured, secure mode is not enabled and access to the scan chain is prevented. Responsive to determining that the programmable IC is not configured, the secure mode can be enabled and access to the scan chain can be allowed.

Another embodiment of the present invention can include a system for securing a DFT scan chain within a programmable IC. The system can include a controller configured to receive a request for access to a scan chain while the programmable IC is in an operational mode. The controller can be configured to selectively enable a secure mode that provides access to the scan chain responsive to receiving the request according to a configuration state of the programmable IC. Subsequent to the programmable IC entering the secure mode, the controller can be configured to retain the programmable IC in the secure mode and prevent the programmable IC from re-entering the operational mode until the programmable IC is power cycled.

DETAILED DESCRIPTION OF THE DRAWINGS

Figure 1:
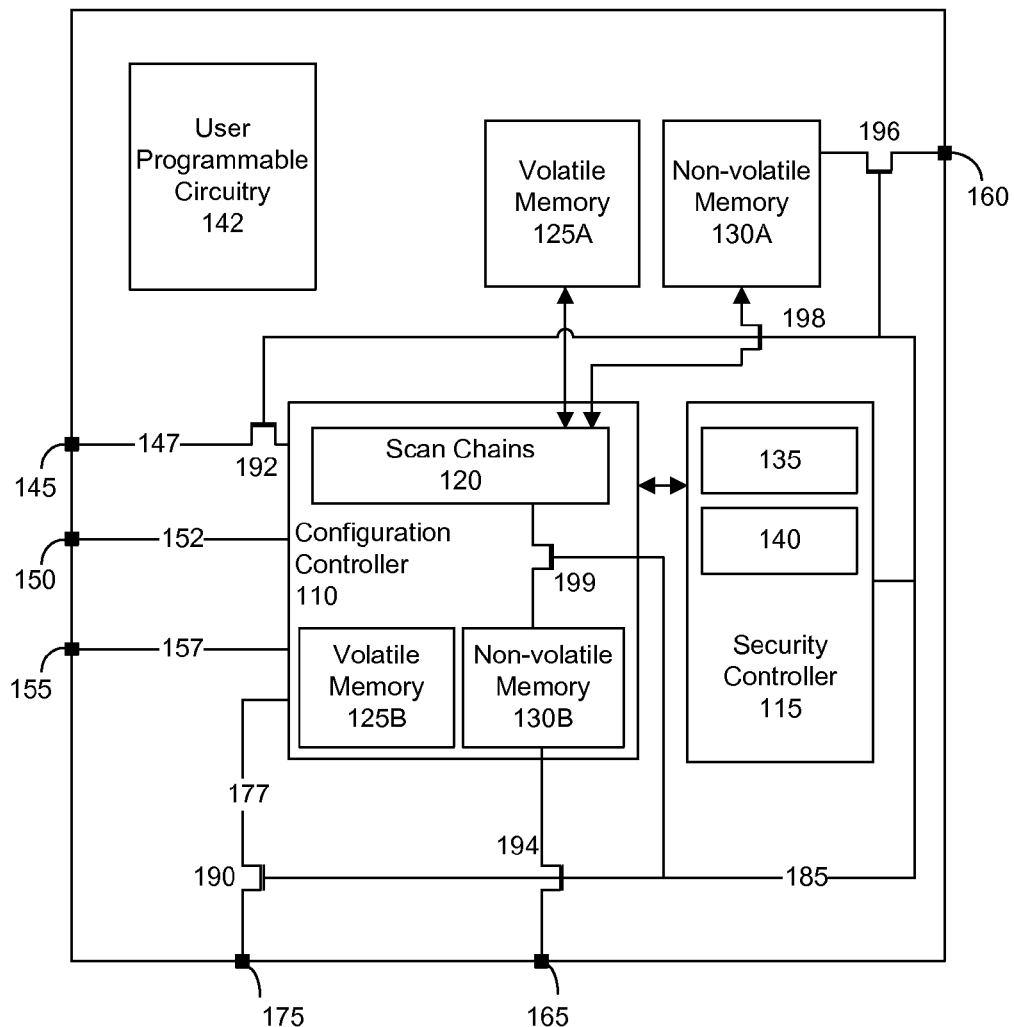
FIG. 1 is a block diagram illustrating an integrated circuit device including scan chain security in accordance with one embodiment of the present invention.

While the specification concludes with claims defining the features of one or more embodiments of the invention that are regarded as novel, it is believed that one or more embodiments of the invention will be better understood from a consideration of the description in conjunction with the drawings. As required, one or more detailed embodiments of the present invention are disclosed herein; however, it is to be understood that the disclosed embodiments are merely exemplary of the inventive arrangements, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of one or more embodiments of the invention.

One or more embodiments disclosed within this specification relate to integrated circuit devices (ICs). The one or more embodiments relate to securing design-for-test (DFT) scan chain features implemented within an IC and, more particularly, within a programmable IC. In accordance with the inventive arrangements disclosed within this specification, to access one or more scan chains implemented within a programmable IC, a secure mode must be invoked within the programmable IC. More particularly, the secure mode must be invoked to access scan chains within a configuration controller of the programmable IC. In general, implementation of secure mode ensures that sensitive data stored within the programmable IC that is vulnerable to attack is secured prior to granting access to, or enabling, the scan chain circuitry.

Secure mode implementation prevents the IC from being returned to an operational mode through which operational functionality or circuit architecture within the programmable IC can be discerned. Invoking secure mode can include performing a variety of different tasks such as, for example, resetting volatile memory and erasable non-volatile memory within the IC. Invoking secure mode can include making non-erasable, non-volatile memory within the IC inaccessible from the one or more scan chain and/or input ports of the IC. Additionally, prior to invoking secure mode, a determination can be made as to whether the programmable IC has been configured. The programmable IC can be prevented from entering secure mode when it is determined that the programmable IC has been configured.

Responsive to the IC entering secure mode, configuration of the programmable IC can be blocked or otherwise prevented from occurring. The programmable IC remains in secure mode until powered off. In order to return the programmable IC to operational mode, the programmable IC can be required to be power cycled. In this manner, sensitive data stored within the IC can be secured prior to a user accessing the scan chain structure or the scan chain structure being enabled.

As used herein, securing data can include purging or erasing data, physically blocking access to a memory, memories, or selected memory location(s), or otherwise making a memory, memories, or selected memory location(s) inaccessible. Normal operation of the programmable IC, e.g., non-DFT functionality, can be blocked until a complete power cycle is performed on the programmable IC. Within this specification, the term "scan chain structure" refers to one or more scan chains implemented within a programmable IC through which DFT operations can be performed upon the programmable IC. When in secure mode, the scan chain structure within the programmable IC can be accessed to implement DFT operations.

FIG. 1 is a block diagram illustrating a programmable IC 100 including a scan chain structure in accordance with one embodiment of the present invention. Programmable IC 100 can be implemented as any of a variety of different programmable IC types manufactured using any of a variety of IC manufacturing process technologies. As shown, programmable IC 100 can include a configuration controller 110, security controller 115, scan chains 120, volatile memory 125, non-volatile memory 130, and user programmable circuitry 142.

The phrase "sensitive data," as used within this specification, can refer to any information to which a party wishes to restrict access by others. For purposes of illustration, and by way of example, sensitive data can include data that is discernable from programmable IC 100 as embodied within configured user programmable circuitry 142, volatile memory 125, or non-volatile memory 130. Sensitive data can include some aspects of operational data, i.e., data used, stored, or processed during typical operation of programmable IC 100, as well as information that can be inferred from architectural circuit structures or data processing functionality of operational circuit structures implemented within user programmable circuitry 142 when configured.

Configuration controller 110 can be implemented as nonuser programmable circuitry. Configuration controller 110 can control configuration of programmable IC 100. As shown, configuration controller 110 can receive signal 147 through command port 145 requesting DFT operations to be performed that involve access to scan chains 120 within configuration controller 110. When in secure mode, configuration controller 110 can receive one or more test vectors for DFT operations in the form of test signal 152 through test port 150. Configuration controller 110 can output one or more result vectors in the form of result signal 157 through result port 155 when programmable IC 100 is in secure mode. Configuration controller 110 can enable operational and physical aspects of programmable IC 100 in order to perform configuration functions and additional DFT operations within programmable IC 100.

Apart from the aforementioned functions, configuration controller 110 can control the propagation of test vectors through test port 150 into appropriate ones of scan chains 120 within programmable IC 100. Configuration controller 110 can also control the propagation of result vectors out of select ones of scan chains 120 within programmable IC 100 through result port 155. In addition, configuration controller 110 can control the configuration of programmable IC 100 by controlling the loading of configuration data, e.g., a bitstream, into configuration memory. Configuration data specifies a user circuit design that can be instantiated within user programmable circuitry 142. For example, configuration controller 110 can receive configuration data through configuration port 175 and/or command port 145.

As used within this specification, the phrase "operational mode," can refer to a mode in which programmable IC 100 functions in a manner that performs the intended nominal functional actions and data processing for which programmable IC 100 has been programmed, via an instantiated user circuit design, for example, to perform. When in operational mode, the DFT functions of programmable IC 100 are disabled. For example, scan chains 120 are not accessible. Thus, the circuit design instantiated within user programmable circuitry 142, when in operational mode, performs its intended function with DFT functions, such as scan chains 120, being disabled or inactive. When components of scan chains 120 are able to perform dual functions in terms of performing a task within configuration controller 110 and performing scan chain functions, the components are operable to perform the user circuit design task, and not the scan chain related functions, when in operational mode.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

As shown, configuration controller 110 can include scan chains 120. Scan chains 120 can include one or more shift registers implemented within configuration controller 110. In one aspect, each shift register can be implemented with flip-flops that exist within configuration controller 110, and thus, are available to implement the configuration functionality of configuration controller 110 when not used for DFT functions, e.g., to perform operational mode functions within programmable IC 100. The flip-flops of scan chains 120 can be configured to selectively accept either an operational mode input or a DFT data input specified via test signal 152 to configuration controller 110. Alternatively, or in combination, the flip-flops of scan chains 120 can be configured to selectively accept either an operational mode input or output DFT data from particular circuits being fault tested.

In another aspect, additional flip-flops that are non-essential or not usable to provide operational mode functions may be necessary to fully implement DFT operations within scan chains 120. Although scan chains 120 are depicted as a distinct block within FIG. 1, scan chains 120 can be implemented in a distributed manner, co-mingled within different portions of configuration controller 110 within programmable IC 100. As such, illustration of scan chains 120 as a distinct block is not intended to be limiting, but rather to provide an understandable description of one or more embodiments within this specification.

Each of the one or more shift registers within scan chains 120 can be used to input test data specified by test signal 152 to one or more sections of configuration controller 110 or receive output data from one or more sections of configuration controller 110 to be output as result signal 157. When a shift register within scan chains 120 is implemented as a test scan chain, each dual purpose flip-flop within each test scan chain can be configured to receive operational data via a first input during operational mode and input DFT data via a second input when in secure mode. Flip-flops dedicated only for scan chain use can include one input for receiving input DFT data and are unable to receive operational data. Each flip-flop in the test scan chain can provide a known input, e.g., a portion of the input DFT data, to a particular section of configuration controller 110.

When a shift register within scan chains 120 is implemented as a result scan chain, each flip-flop within each result scan chain can be configured to receive operational data via first input during operational mode and output DFT data via a second input when in secure mode. Flip-flops dedicated only for scan chain use can include one input for receiving output DFT data and are unable to receive operational data. Each flip-flop in the result scan chain can provide an output DFT data from a particular section of configuration controller 110 to an output port of the programmable IC 100.

Security controller 115 can be implemented as non-user programmable circuitry. Although implemented as an independent block in FIG. 1, security controller 115 can be implemented as an add-on to, or included within, configuration controller 110. As such, illustration of security controller 115 as a distinct block is not intended to be limiting, but rather to provide an understandable description of one or more embodiments within this specification. Security controller 115, in general, controls when programmable IC 100 enters operational mode or secure mode.

In one embodiment, security controller 115 can selectively enable and/or implement secure mode within programmable IC 100, at least in part, responsive to signal 177 through port 175. In another embodiment, security controller 115 can selectively enable and/or implement secure mode within programmable IC 100 responsive to configuration signal 147 through port 145. In that case, port 145 can be implemented as, for example, a JTAG interface to programmable IC 100. When switching between operational mode and secure mode, security controller 115 can enable and disable various operational and physical aspects of programmable IC 100 that differentiate operational mode from secure mode. In one aspect, either or both of signals 147 and 177 can be passed through configuration controller 110 to security controller 115. Alternatively, though not shown, such signals can be routed directly to security controller 115 in addition to, or in lieu of, configuration controller 110.

Operational and functional aspects of programmable IC 100 that can be selectively enabled by security controller 115 can include resetting volatile memory 125, resetting erasable regions of non-volatile memory 130 including resetting hardware logic circuits that retain state, blocking access through scan chains 120 to non-erasable regions of non-volatile memory 130, e.g., via blocking input ports 160 and 165, disabling configuration functions of configuration controller 110, selectively blocking command port 145 and configuration port 175, and preventing programmable IC 100 from returning to operational mode subsequent to entering secure mode without first power cycling programmable IC 100.

Volatile memory 125 refers collectively to memory or memories within programmable IC 100 that can store data and that are cleared or erased, e.g., do not maintain state, when programmable IC 100 is powered down. In general, examples of volatile memory 125 can include, but are not limited to, random access memories (RAMs), selected types of flip-flops and/or latches, dynamic memory cells, static memory cells, and the like. In one embodiment, volatile memory 125A, which is shown to be distinct from volatile memory 125B within configuration controller 110, can represent, or include, configuration memory of programmable IC 100. Configuration controller 110 can instantiate a user specified circuit design within user programmable circuitry 142 by loading configuration data, e.g., a programmatic circuit design, sometimes referred to as a bitstream, within configuration memory. In one aspect, volatile memories 125A and 125B can receive a reset signal, e.g., a global reset signal, initiated by or generated from security controller 115 and clear data stored within the one or more or all memory locations(s) of volatile memories 125A and 125B responsive to the reset signal.

It should be appreciated that although volatile memories 125A and 125B are shown as distinct memory blocks within FIG. 1, volatile memory elements can be distributed throughout programmable IC 100. For example, volatile memories 125A and 125B can be implemented as one or more, e.g., more than two, memories that are distributed and/or co-mingled with circuitry throughout programmable IC 100. As such, the illustration of volatile memory 125 in the form of volatile memory 125A, being external to configuration controller 110, and volatile memory 125B, being within configuration controller 110, is intended for purposes of illustration only without limitation.

Non-volatile memory 130 refers collectively to memory or memories within programmable IC 100 that can store data and that are not cleared or erased responsive to power-off of programmable IC 100. For purposes of illustration, non-volatile memory 130 is illustrated as non-volatile memory 130A, being external to configuration controller 110, and non-volatile memory 130B, being within configuration controller 110. As was the case with volatile memory 125, non-volatile memory 130 can be implemented in the form of one or more, e.g., more than two, non-volatile memories that are distributed and/or co-mingled with circuitry throughout programmable IC 100. Examples of non-volatile memory 130 can include flash memory, programmable memory, erasable-programmable memory, E-fuse memory cells, selected types of flip-flops and/or latches, and the like.

One or more sections of non-volatile memory 130A and/or non-volatile memory 130B can be implemented in the form of erasable, non-volatile memory and/or non-erasable, non-volatile memory. Data stored within erasable, non-volatile memory can be erased, for example, responsive to a reset signal or other erase command. Erasable non-volatile memory can include battery backed RAM, selected digital logic circuits, e.g., flip-flops, and latches, that may be placed in a user defined, or manufacturer defined state at power-on of programmable IC 100.

Data stored in non-erasable, non-volatile memory cannot be erased. Non-erasable, non-volatile memory can include, for example, E-fuses or one time programmable and/or electrically programmable read only memories. Non-erasable, non-volatile memory within non-volatile memory 130A and/or non-volatile memory 130B can be secured by physically blocking access to the respective non-erasable, non-volatile memories, e.g., via gating of ports or input signals to such memories.

User programmable circuitry 142 can include a variety of electronic devices that perform the operational functions implemented by programmable IC 100. User programmable circuitry 142 can include one or more circuit block(s) intended to perform distinct functions within programmable IC 100, as well as individual logic blocks or logic devices. For example, user programmable circuitry 142 can include functional circuit blocks such as digital signal processing blocks, state machines, processors, memories, look-up tables, and the like. In addition, user programmable circuitry 142 can include individual logic blocks or devices such as flip-flops, memory cells, logic gates, multiplexers, and the like. In one aspect, user programmable circuitry 142 can include the programmable fabric of programmable IC 100 within which a user specified circuit design is instantiated by the loading of a programmatic circuit design within configuration memory, e.g., volatile memory 125A, of programmable IC 100.

For purposes of illustration, configuration memory is described within this specification as being volatile memory. It should be appreciated, however, that configuration memory can be implemented as non-volatile memory. When implemented as non-volatile memory, techniques for erasing and/or blocking access to memory can be applied to secure the configuration memory as generally described within this specification.

In operation, when power is applied to programmable IC 100, referred to as "power-on," programmable IC 100 can begin in operational mode. A configuration indicator 135 and a secure mode indicator 140 can be cleared by security controller 115 subsequent to power-on. For example, configuration indicator 135 and secure mode indicator 140 can be cleared as part of a start-up protocol implemented within programmable IC 100 responsive to power-on. Though shown as part of security controller 115, one or both of configuration indicator 135 and/or secure mode indicator 140 can be located external to security controller 115.

In one embodiment, each of configuration indicator 135 and secure mode indicator 140 can be implemented as a flip-flip within a register used to generate a configuration signal and a secure mode signal (not shown), respectively. Changing the state of each flip-flop implemented as an indicator, and thereby the output of each flip-flop output, as well as the configuration and secure mode signals, can indicate whether IC device 100 has been configured or placed in secure mode subsequent to power-on of IC device 100. In another embodiment, each of configuration indicator 135 and secure mode indicator 140 can be the output of three or more flip-flops within a register.

Configuration indicator 135 indicates whether programmable IC 100 has been configured since power-on. More particularly, when configuration data has not been loaded into configuration memory to instantiate a user specified circuit design within user programmable circuitry 142, configuration indicator 135 remains cleared. When configuration indicator 135 is set, programmable IC 100 has been configured, at least partially configured, or received a configuration request subsequent to power-on. While in operational mode, security controller 115 can monitor for the loading of configuration data into configuration memory, e.g., volatile memory 125B, of programmable IC 100 or the receipt of a configuration request. Responsive to the loading of configuration data, or a request to do so, security controller 115 can set configuration indicator 135.

Secure mode indicator 140 indicates whether secure mode has been implemented within programmable IC 100. More particularly, when secure mode indicator 140 is cleared, programmable IC 100 is in operational mode and has not been placed into secure mode since power-on. When secure mode indicator 140 is set, programmable IC 100 has been placed in secure mode subsequent to power-on.

With each of configuration indicator 135 and secure mode indicator 140 cleared, programmable IC 100 can continue in operational mode until a user request to enable secure mode is received by programmable IC 100 via signal 147. Signal 147 can be input data encoded as one or more bits of data that direct programmable IC 100 to enable secure mode. For example, a request to enter secure mode can include a request to implement DFT operations, to access scan chains 120, or the like. In one embodiment, port 145 can represent part, or all, of a JTAG interface implemented within the programmable IC 100.

Subsequent to receiving a request to enter secure mode, security controller 115 can selectively enable secure mode according to a configuration state of programmable IC 100. The configuration state of programmable IC 100 can be determined according to configuration indicator 135. When configuration indicator 135 is set, security controller 115 can determine that programmable IC 100 is configured. With security controller 115 determining that programmable IC 100 is configured, security controller 115 can block or otherwise prevent entry of programmable IC 100 into secure mode. Thus, scan chains 120 are, and remain, disabled. For example, security controller 115 can block or otherwise disable inputs that receive DFT data to one or more or all flip-flops of scan chain 120, thereby blocking or otherwise disabling scan chains 120.

Within conventional programmable ICs, scan chains are not implemented within a configuration controller to prevent the scan chains from creating security vulnerabilities. For example, without the features described within this specification, implementation of scan chains for DFT within a configuration controller can allow an unauthorized user to access configuration or other sensitive data subsequent to configuring the programmable IC. To prevent this form of security vulnerability, security controller 115 can block entry of programmable IC 100 into secure mode and disable scan chains 120 subsequent to configuration of programmable IC 100.

When configuration indicator 135 is cleared, security controller 115 can determine that programmable IC 100 is not configured and has not been configured since power-on. With security controller 115 determining that programmable IC 100 is not configured, security controller 115 can allow programmable IC 100 to enter secure mode. In secure mode, access to scan chains 120 is provided. For example, security controller 115 can unblock inputs to flip-flops that receive DFT data or otherwise enable scan chains 120.

As configuration data is typically sensitive data to be protected from external attack by unauthorized users, determining that programmable IC 100 has not been configured prior to entering secure mode can assure that configuration data is not present within programmable IC 100 prior to entering secure mode. Further, as configuration data is a subset of volatile memory 125, e.g., volatile memory 125A, configuration data is cleared at power-off of programmable IC 100. Accordingly, when no configuration data has been loaded subsequent to power-on, no configuration data is available within programmable IC 100 when secure mode is entered that can be accessed through scan chains 120. The same is true with respect to tracking device configuration when the configuration memory is implemented as non-volatile memory.

Subsequent to determining that programmable IC 100 is not configured, security controller 115 can enable secure mode. For example, security controller 115 can clear data stored within volatile memories 125A and 125B. Security controller 115 also can clear one or more erasable regions of non-volatile memories 130A and 130B within programmable IC 100. In one embodiment, a global reset feature of programmable IC 100 can be invoked to clear volatile memories 125A and 125B and one or more erasable sections of non-volatile memories 130A and 130B.

Security controller 115, as part of enabling secure mode, can secure non-erasable, non-volatile memory by blocking signal pathways to such memory, thereby rendering the non-erasable, non-volatile memory inaccessible. Access to other selected circuits also can be blocked if deemed necessary. In one embodiment, each of input ports 160 and 165 of programmable IC 100 can be gated. For example, security controller 115 can control the state of each of gates 190, 192, 194, 196, 198, and 199 via control signal 185. When programmable IC 100 is in operational mode, security controller 115 can alter the state of each of gates 194 and 196 to create a signal pathway between each of input ports 160 and 165 and a corresponding internal circuit of programmable IC 100 containing sensitive data.

When secure mode is enabled and while in secure mode, security controller 115 can change the state of each of gates 194 and 196, via control signal 185, to block the signal pathway between each of input ports 160 and 165 and the corresponding internal circuit within programmable IC 100 containing sensitive data. Although illustrated as a single transistor in FIG. 1, each of gates 190-198 can be implemented with any of a variety of switch architectures. Accordingly, the use of a single transistor to illustrate gates 190-198 is not intended to be limiting, but rather to provide an understandable description of one or more embodiments within this specification. For example, a transmission gate can be coupled between each of input ports 160 and 165 and a corresponding non-erasable memory location within non-volatile memories 130A or 130B. The security controller 115 can selectively alter control signal 185 to switch the transmission gates between a high and low impedance state, thereby alternating between creating and blocking each signal pathway between input ports 160 and 165 and the corresponding non-erasable memory locations within non-volatile memories 130A or 130B.

To further render sensitive data inaccessible in secure mode, security controller 115 can block the signal pathway between each non-erasable memory location within non-volatile memories 130A and 130B and each flip-flop within scan chains 120. As data stored within non-erasable sections of non-volatile memories 130A and 130B cannot be cleared, each signal path to a non-erasable memory location within non-volatile memories 130A or 130B can be blocked to prevent access to sensitive data within non-volatile memories 130A and 130B through scan chains 120.

In one embodiment, the signal path between each non-erasable memory location within non-volatile memories 130A and 130B and corresponding flip-flops within scan chains 120 can be gated to control access to non-volatile memories 130A and 130B. Security controller 115, via control signal 185, can control gate 198, coupled between a non-erasable memory location within non-volatile memory 130A and a flip-flop within scan chains 120. Security controller 115 can alter the state of gate 198 via control signal 185 to create a signal pathway between the non-erasable memory location within non-volatile memory 130A and the flip-flop within scan chains 120 in operational mode. In secure mode, security controller 115 can alter the state of gate 198, via control signal 185, to block the signal path between the non-erasable memory location within non-volatile memory 130A and the location within scan chains 120. Similarly, security controller 115, via control signal 185, can control gate 199, coupled between a non-erasable memory location within non-volatile memory 130B and a flip-flop within scan chains 120. Security controller 115 can alter the state of gate 199 via control signal 185 to create a signal pathway between the non-erasable memory location within non-volatile memory 130B and the flip-flop within scan chains 120 in operational mode. In secure mode, security controller 115 can alter the state of gate 199, via control signal 185, to block the signal path between the non-erasable memory location within non-volatile memory 130B and the location within scan chains 120.

Further in secure mode, security controller 115 can disable configuration functions within programmable IC 100. Upon enabling secure mode, security controller 115 can set secure mode indicator 140. With secure mode indicator 140 set, security controller 115 can disable configuration functions within programmable IC 100. Disabling configuration functions within programmable IC 100 can prevent configuration data, e.g., a circuit design, from being stored and/or instantiated within programmable IC 100 subsequent to entering secure mode.

For example, security controller 115 can alter the state of gate 190 via control signal 185. When programmable IC 100 is in operational mode, security controller 115 can alter the state of gate 190 to create a signal path between configuration port 175 and configuration controller 110. When programmable IC 100 is in secure mode, security controller 115 can alter the state of gate 190 to block the signal path between configuration port 175 and configuration controller 110.

Allowing the configuration of programmable IC 100 while scan chains 120 are enabled can provide unauthorized users access to sensitive data within programmable IC 100. It should be noted that accessing sensitive data can entail determining the operational functionality of circuits within programmable IC 100 as well as sensitive data stored within memory locations within programmable IC 100. In addition, allowing the configuration of programmable IC 100 can enable an unauthorized user to return programmable IC 100 to an operational mode in order to access sensitive data that may be inferred from the operation of programmable IC 100 or through read-back functionality available through the JTAG port.

In secure mode, security controller 115 can disable test functions, e.g. boundary scan testing, within programmable IC 100. Upon enabling secure mode, security controller 115 can disable test functions within programmable IC 100. As noted, in one embodiment, command port 145 can be implemented as JTAG interface through which boundary scan testing, single-step and break point control and monitoring, halt mode monitoring, encryption key storage and access, and the like can be performed or provided. For example, security controller 115 can alter the state of gate 192 via control signal 185. When programmable IC 100 is in operational mode, security controller 115 can alter the state of gate 192 to create a signal path between configuration port 145 and configuration controller 110. When programmable IC 100 is in secure mode, security controller 115 can alter the state of gate 192 to block the signal path between configuration port 145 and configuration controller 110.

Having entered secure mode, programmable IC 100 can allow access to scan chains 120 for DFT operations. Subsequent to entering secure mode, secure mode indicator 135 can be set and security controller 115 can retain programmable IC 100 in secure mode up to, and until, programmable IC 100 is powered off and then powered-on, e.g., power cycled. Thus, security controller 115 can block programmable IC 100 from re-entering operational mode until programmable IC 100 is power cycled. In one embodiment, setting secure mode indicator 135 can direct security controller 115 to block programmable IC 100 from returning to operational mode. In this manner the security controller 115 can assure access to sensitive data though scan chains 120 is blocked up to, and until, programmable IC 100 is powered down. By power cycling programmable IC 100, security controller 115 ensures that subsequent to enabling secure mode, data stored in volatile memory 125 is cleared at least in consequence of power cycling and that access to scan chains 120 is blocked at power-on at least until secure mode can be re-entered as disclosed herein.

Figure 2:
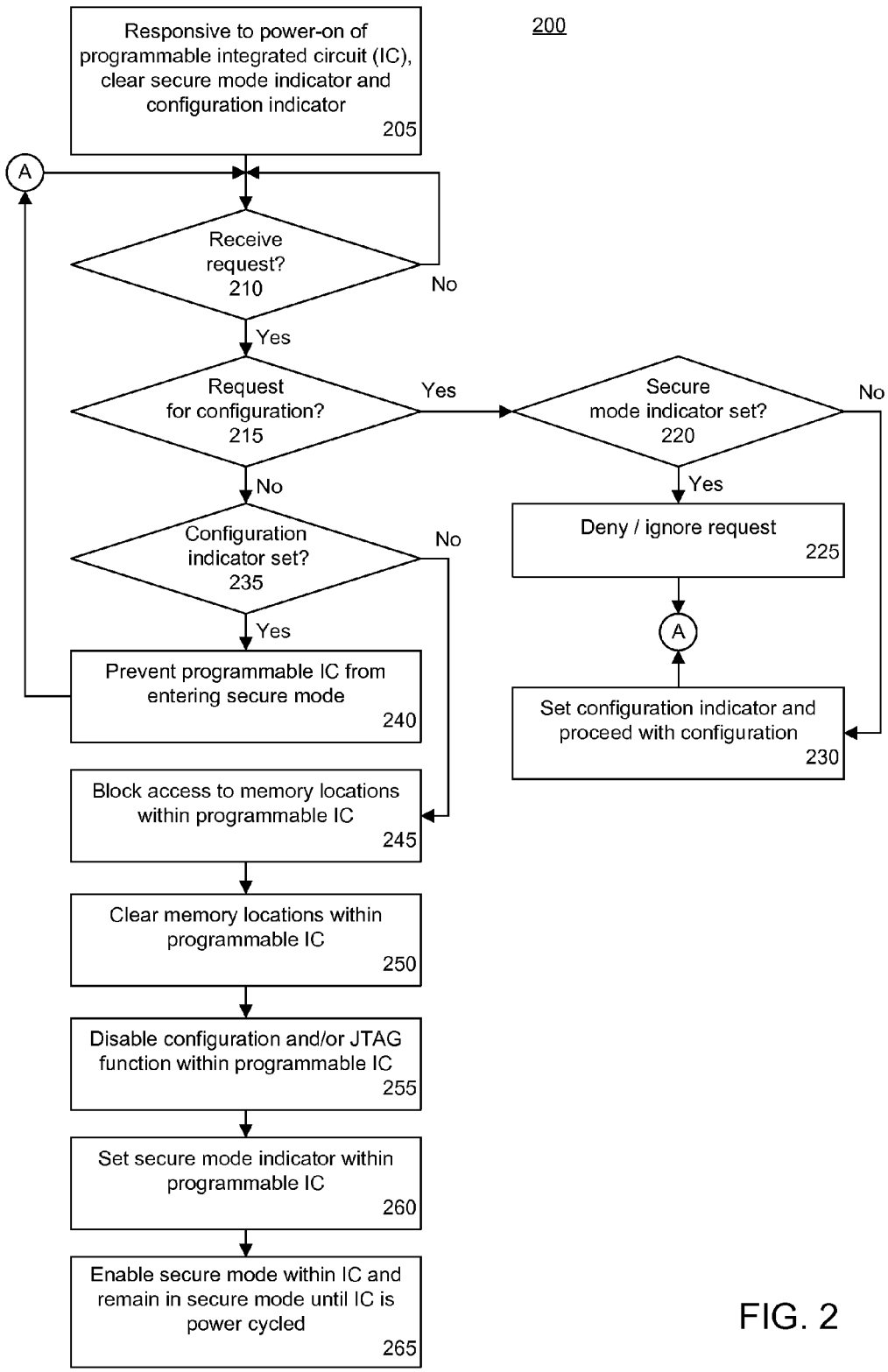
FIG. 2 is a flow chart illustrating a method of performing scan chain security in accordance with another embodiment of the present invention.

FIG. 2 is a flow chart illustrating a method 200 of performing scan chain security in accordance with another embodiment of the present invention. Method 200 can be implemented using a programmable IC as described with reference to FIG. 1. In general, method 200 describes a method of providing a secure DFT scan chain within a programmable IC.

Beginning in step 205, a security controller within the programmable IC, responsive to a power-on state within the programmable IC, can clear a secure mode indicator and a configuration indicator. As noted, the programmable IC can enter operational mode responsive to power-on. Clearing the secure mode indicator indicates that the programmable IC has not entered secure mode subsequent to power-on. Clearing the configuration indicator indicates the programmable IC has not been configured subsequent to power-on.

In step 210, the security controller can begin to monitor for received requests. When no request is received, method 200 can loop back and continue monitoring for a request. When a request is received, method 200 can continue to step 215. In step 215, the security controller can determine whether the received request is a request for configuration. If so, method 200 can continue to step 220. If not, method 200 can proceed to step 235.

In step 220, the security controller can determine whether the IC is in secure mode according to whether the secure mode indicator is set. If so, method 200 continues to step 225. If not, method 200 proceeds to step 230. In step 225, when a configuration request is received and the secure mode indicator is set, the request for configuration is denied or otherwise ignored. The security controller prevents configuration of the programmable IC from occurring, e.g., via gating the configuration port, the configuration memory, or via some other means. In step 230, when a configuration request is received and the secure mode indicator is not set, the security controller sets the configuration indicator and permits the configuration process to continue. Thus, a circuit design can be loaded into configuration memory and instantiated in user programmable circuitry of the programmable IC. After step 230, method 200 can loop back to continue monitoring for requests.

Continuing with step 235, having determined that the received request is not a request for configuration, the security controller can determine that the received request is a request for secure mode entry, e.g., scan chain testing. Accordingly, the security controller can determine whether the configuration indicator is set. If so, method 200 can continue to step 240. If not, method 200 can proceed to step 245. It should be appreciated that for purposes of illustration, only two types of requests are used as examples in FIG. 2. Other requests, however, also can be received and evaluated without limitation. Accordingly, the use of configuration requests and secure mode entry requests are for purposes of illustration only.

In step 240, when a request for secure mode is received and the configuration indicator is set, the security controller prevents entry into secure mode. After step 240, method 200 can loop back and continue monitoring for requests.

When a request for entry into secure mode is received and the configuration indicator is not set, the security controller can begin to enable secure mode. Accordingly, in step 245, the security controller can block access to selected locations of memory within the programmable IC. For example, the security controller can block access to non-erasable, non-volatile memory locations within the programmable IC that are accessible through the scan chain structure. The security controller also can block access to one or more non-erasable, non-volatile memory locations within the programmable IC that are accessible through one or more input ports of the IC.

In step 250, the security controller can clear memory locations within the programmable IC. For example, the security controller can clear one or more volatile memory locations and one or more erasable non-volatile memory locations within the programmable IC. In one aspect, the security controller can clear all volatile memory and erasable non-volatile memory within the programmable IC accessible through the scan chain structure implemented within the programmable IC and/or via input ports of the programmable IC. In another aspect, a global reset of the programmable IC can be activated to clear selected flip-flops, latches, and memory cells storing sensitive data within the programmable IC.

In step 255, the security controller can disable configuration and/or JTAG functions within the programmable IC. In step 260, the security controller can set the secure mode indicator. Setting the secure mode indicator indicates that the programmable IC has entered secure mode subsequent to power-on. In step 265, the security controller can enable secure mode within IC. For example, the security controller can enable the scan chains or otherwise make the scan chains available. With secure mode enabled, a user can access the scan chain structure implemented within the programmable IC in order to perform DFT operations. As noted, the security controller can prevent or block the programmable IC from re-entering operational mode until the programmable IC is power cycled. The programmable IC can be returned to operational mode by powering down the programmable IC while in secure mode and subsequently powering on the programmable IC. Upon power-on, method 200 can begin at step 205 as described herein in operational mode.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments of the present invention can be realized in hardware or a combination of hardware and software. The one or more embodiments can be realized in a centralized fashion in one system or in a distributed fashion where different elements are spread across several interconnected systems. Any kind of data processing system or other apparatus adapted for carrying out the methods described herein is suited.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The one or more embodiments disclosed herein can be embodied in other forms without departing from the spirit or essential attributes thereof. Accordingly, reference should be made to the following claims, rather than to the foregoing specification, as indicating the scope of the embodiments of the present invention.

What is claimed is:

1. A method of securing a design-for-test scan chain within a programmable integrated circuit device (IC), the method comprising:
   placing the programmable IC in an operational mode;
   responsive to a request to access a scan chain within the programmable IC, selectively enabling a secure mode within the programmable IC according to a configuration state of the programmable IC, wherein enabling secure mode within the programmable IC provides access to the scan chain; and
   responsive to enabling the secure mode, retaining the programmable IC in the secure mode and preventing the programmable IC from re-entering the operational mode until the programmable IC is power cycled.

2. The method of claim 1, wherein selectively enabling the secure mode further comprises:
   determining the configuration state of the programmable IC;
   responsive to determining that the programmable IC is configured, not enabling the secure mode and preventing access to the scan chain; and
   responsive to determining that the programmable IC is not configured, enabling the secure mode and allowing access to the scan chain.

3. The method of claim 2, wherein enabling the secure mode further comprises:
   clearing data stored within at least one memory of the programmable IC;
   disabling physical access to at least one other memory of the programmable IC; and
   disabling a configuration or a testing function of the programmable IC.

4. The method of claim 1, further comprising:
   clearing a secure mode indicator subsequent to power-on of the programmable IC, wherein clearing the secure mode indicator indicates that the programmable IC has not entered the secure mode subsequent to power-on; and
   setting the secure mode indicator responsive to the request to access the scan chain when the programmable IC has not been configured since power-on, wherein setting the secure mode indicator indicates that the programmable IC has entered the secure mode subsequent to power-on.

5. The method of claim 1, further comprising disabling a configuration function responsive to enabling the secure mode.

6. The method of claim 3, wherein clearing data stored within the at least one memory of the programmable IC further comprises clearing data stored within the at least one memory via a global reset.

7. The method of claim 3, wherein disabling physical access to the at least one other memory of the programmable IC further comprises:
   blocking each signal pathway between the scan chain and the at least one other memory; and
   blocking each signal pathway between an input port of the programmable IC and the at least one other memory.

8. The method of claim 7, wherein blocking each signal pathway between the scan chain and the at least one other memory further comprises gating each signal pathway between a flip-flop of the scan chain and a non-erasable, non-volatile memory.

9. The method of claim 7, wherein blocking each signal pathway between an input port of the programmable IC and the at least one other memory further comprises gating each signal pathway between the input port and a non-erasable, non-volatile memory.

10. The method of claim 1, further comprising:
    clearing a configuration indicator responsive to power-on of the programmable IC, wherein clearing the configuration indicator indicates that the programmable IC has not been configured subsequent to power-on; and
    setting the configuration indicator responsive to configuration of the programmable IC, wherein setting the configuration indicator indicates the programmable IC has been configured subsequent to power-on.

11. A method of securing a design-for-test scan chain within a programmable integrated circuit device (IC), the method comprising:
    placing the programmable IC in an operational mode;
    responsive to a request to access a scan chain within the programmable IC,
      determining a configuration state of the programmable IC; and
      selectively providing access to the scan chain through enablement of a secure mode within the programmable IC according to the configuration state of the programmable IC;
    responsive to determining that the programmable IC is configured, not enabling the secure mode and preventing access to the scan chain; and
    responsive to determining that the programmable IC is not configured, enabling the secure mode and allowing access to the scan chain.

12. The method of claim 11, further comprising, responsive to enabling the secure mode, retaining the programmable IC in the secure mode and preventing the programmable IC from re-entering the operational mode until the programmable IC is power cycled.

13. The method of claim 11, wherein enabling the secure mode further comprises:
    clearing data stored within at least one memory of the programmable IC;
    disabling physical access to at least one memory location of the programmable IC; and
    disabling a configuration or a testing function of the programmable IC.

14. The method of claim 11, further comprising:
    clearing a secure mode indicator subsequent to power-on of the programmable IC, wherein clearing the secure mode indicator indicates that the programmable IC has not entered the secure mode subsequent to power-on; and
    setting the secure mode indicator responsive to the request to access the scan chain when the programmable IC has not been configured since power-on, wherein setting the secure mode indicator indicates that the programmable IC has entered the secure mode subsequent to power-on.

15. The method of claim 11, further comprising disabling a configuration function responsive to enabling the secure mode.

16. A system for securing a design-for-test scan chain within a programmable integrated circuit (IC), the system comprising:
    a controller configured to receive a request for access to a scan chain while the programmable IC is in an operational mode, wherein the controller is configured to selectively enable a secure mode that provides access to the scan chain responsive to receiving the request according to a configuration state of the programmable IC, and wherein subsequent to the programmable IC entering the secure mode, the controller is configured to retain the programmable IC in the secure mode and prevent the programmable IC from re-entering the operational mode until the programmable IC is power cycled.

17. The system of claim 16, wherein the controller is further configured to:
   determine the configuration state of the programmable IC;
   responsive to determining that the programmable IC is configured, not enable the secure mode and prevent access to the scan chain; and
   responsive to determining the programmable IC is not configured, enable the secure mode and allow access to the scan chain.

18. The system of claim 16, wherein the controller is configured to enable secure mode by:
   clearing data stored within at least one memory of the programmable IC;
   disabling physical access to at least one memory location of the programmable IC; and
   disabling a configuration or a testing function of the programmable IC.

19. The system of claim 16, wherein the controller is further configured to:
   clear a secure mode indicator subsequent to power-on of the programmable IC, wherein clearing the secure mode indicator indicates that the programmable IC has not entered the secure mode subsequent to power-on; and
   set the secure mode indicator responsive to the request for access the scan chain when the programmable IC has not been configured since power-on, wherein setting the secure mode indicator indicates that the programmable IC has entered the secure mode subsequent to power-on.

20. The system of claim 17, wherein controller is further configured to:
   clear a configuration indicator responsive to power-on of the programmable IC, wherein clearing the configuration indicator indicates that the programmable IC has not been configured subsequent to power-on; and
   set the configuration indicator responsive to configuration of the programmable IC, wherein setting the configuration indicator indicates the programmable IC has been configured subsequent to power-on.

* * * * *